United States Patent
Yamamoto et al.

(10) Patent No.: US 7,652,213 B2
(45) Date of Patent: Jan. 26, 2010

(54) INTERNAL CONDUCTOR CONNECTION STRUCTURE AND MULTILAYER SUBSTRATE

(75) Inventors: Issey Yamamoto, Ritto (JP); Naoki Kaise, Okayama (JP); Yutaka Morikita, Omihachiman (JP)

(73) Assignee: Murata Manufacturing Co., Ltd., Kyoto (JP)

(*) Notice: Subject to any disclaimer, the term of this patent is extended or adjusted under 35 U.S.C. 154(b) by 137 days.

(21) Appl. No.: 10/595,259

(22) PCT Filed: Feb. 8, 2005

(86) PCT No.: PCT/JP2005/001815

§ 371 (c)(1),
(2), (4) Date: Mar. 31, 2006

(87) PCT Pub. No.: WO2005/101935

PCT Pub. Date: Oct. 27, 2005

(65) Prior Publication Data

US 2007/0107933 A1 May 17, 2007

(30) Foreign Application Priority Data

Apr. 6, 2004 (JP) ............................. 2004-111976

(51) Int. Cl.
*H01R 12/04* (2006.01)
*H05K 1/11* (2006.01)

(52) U.S. Cl. ..................................... 174/262; 174/264
(58) Field of Classification Search ................ 174/260, 174/262, 263, 264, 265, 266; 361/792, 793, 361/794, 795

See application file for complete search history.

(56) References Cited

U.S. PATENT DOCUMENTS

| | | | | |
|---|---|---|---|---|
| 5,375,042 A * | 12/1994 | Arima et al. | ................. | 361/784 |
| 5,456,778 A * | 10/1995 | Fukuta et al. | ............. | 156/89.17 |
| 6,534,723 B1 * | 3/2003 | Asai et al. | .................... | 174/255 |
| 6,667,443 B2 * | 12/2003 | Kondo et al. | ................. | 174/255 |
| 6,812,576 B1 * | 11/2004 | Fazelpour et al. | ........... | 257/774 |
| 6,855,625 B2 * | 2/2005 | Kondo et al. | ................ | 438/622 |
| 2002/0076903 A1 | 6/2002 | Kondo et al. | | |

FOREIGN PATENT DOCUMENTS

| | | |
|---|---|---|
| JP | 2680443 B2 | 8/1997 |
| JP | 11-074645 | 3/1999 |
| JP | 2000-353872 | 12/2000 |
| JP | 2001-217550 | 8/2001 |
| JP | 2001-284811 | 10/2001 |
| JP | 2003-086948 | 3/2003 |

OTHER PUBLICATIONS

International Search Report for PCT Application No. PCT/JP2005/001815, mailed May 31, 2005.

* cited by examiner

*Primary Examiner*—Ishwar (I. B.) Patel
(74) *Attorney, Agent, or Firm*—Keating & Bennett, LLP

(57) ABSTRACT

A multilayer substrate includes an internal conductor connection structure having first and second via conductors adjacent to each other in the multilayer substrate and a first line conductor disposed in the multilayer substrate. The first via conductor includes a first continuous via conductor arranged to extend in a direction away from the second via conductor, and the first via conductor is connected to the first line conductor through the first continuous via conductor.

16 Claims, 9 Drawing Sheets

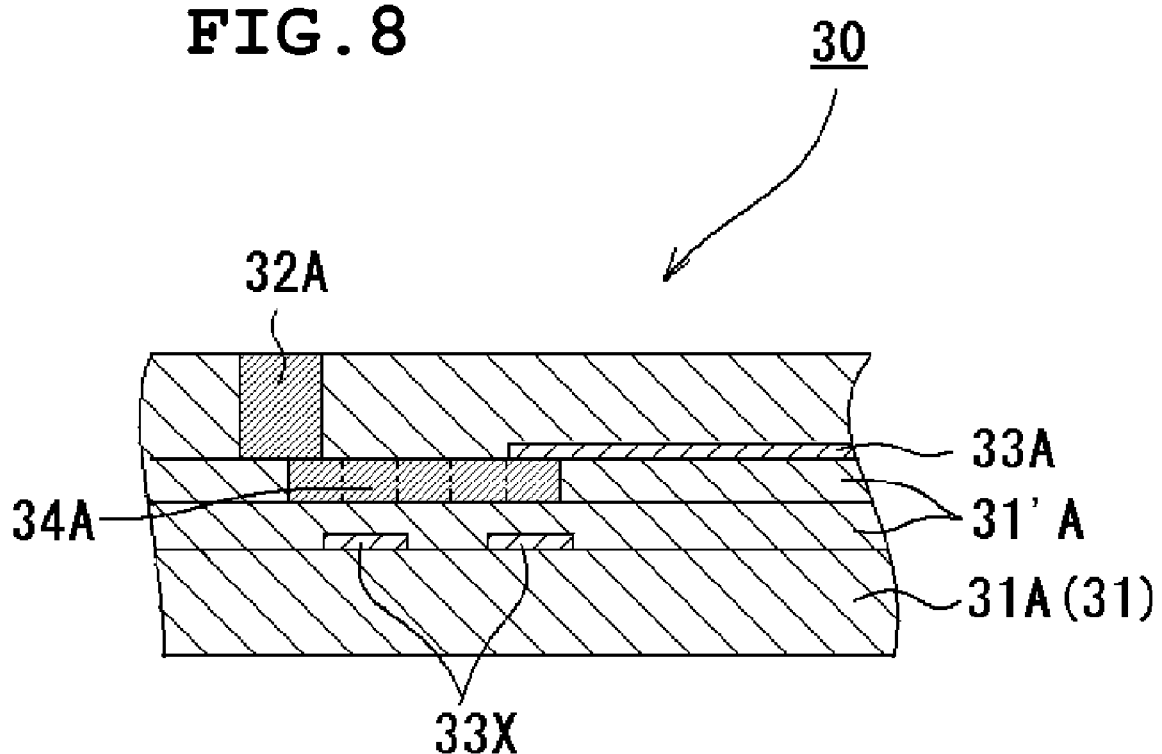

INTERNAL CONDUCTOR CONNECTION STRUCTURE AND MULTILAYER SUBSTRATE

BACKGROUND OF THE INVENTION

1. Field of the Invention

The present invention relates to an internal conductor connection structure and a multilayer substrate. In particular, the present invention relates to an internal conductor connection structure capable of increasing a wiring density and to a multilayer substrate.

2. Description of the Related Art

In recent years, technologies for micromachining integrated circuits have dramatically advanced and, thereby, the number of external terminals of the integrated circuit has been increased, so that a pitch between external terminals has been reduced significantly. Recently, integrated circuits are mounted on ceramic substrates primarily by a flip chip bonding system. Pads for flip chip bonding are disposed on the surface of the ceramic substrate. Since the pitch between bonding pads must be reduced in accordance with a reduction of the pitch between external terminals of the integrated circuit, some methods have been proposed up to now.

For example, Japanese Patent No. 2680443 has proposed a ceramic wiring board provided with no bonding pad. The bonding pad is formed by a printing method or the like. When the number of bonding pads is increased, it becomes difficult to form pads by the printing method or the like. Even when bonding pads can be formed, the strength of bonding to the via conductor is weak, and the reliability cannot be ensured. Consequently, in the technology described in Japanese Patent No. 2680443, a ceramic multilayer substrate is produced by using a conductor paste having a firing shrinkage factor smaller than that of a ceramic green sheet and, thereby, a conductor layer (via conductor) in a through hole is allowed to protrude as a bonding pad from the ceramic multilayer substrate. In this manner, printing of the bonding pad is avoided, the strength of bond between the bonding pad and the via conductor is increased and, in addition, a reduction of pitch between bonding pads is realized. However, in Japanese Patent No. 2680443, no consideration is given to the connection structure of the via conductor and the line conductor in the inside of the ceramic multilayer substrate.

On the other hand, Japanese Unexamined Patent Application Publication No. 2001-284811 has proposed a monolithic ceramic electronic component in which a line conductor is provided with a connecting land, and a connection structure of a via conductor and the line conductor is improved. In the case where the via conductor and the line conductor are connected, a ceramic green sheet provided with the via conductor and a ceramic green sheet provided with the line conductor are aligned, and a laminate of the ceramic green sheets is prepared, followed by sintering. An occurrence of an error cannot be avoided in the formation of the via conductor and the line conductor on the ceramic green sheets, and it is difficult to avoid an occurrence of discrepancies between positions of the via conductor and the line conductor in the preparation of the laminate. Therefore, a poor connection between the via conductor and the line conductor tends to occur in the laminate. Consequently, in this technology, the line conductor is provided with a connecting land having a diameter larger than the outer diameter of the via conductor and, thereby, the occurrence of a poor connection resulting from the error and discrepancies between positions is prevented.

Japanese Unexamined Patent Application Publication No. 11-074645 has proposed a method for manufacturing a multilayer ceramic substrate, in which the wiring density can be increased. In this case, as shown in FIGS. 9A and 9B, a connecting land 3 is provided on the lower end of a via conductor 2 disposed in a multilayer ceramic substrate 1, and when via conductors 2 are adjacent to each other, their respective connecting lands 3 are provided in mutually different respective ceramic layers. The via conductors 3 are connected to line conductors 4 through the connecting lands 3. This technology is in common with the technology in Japanese Unexamined Patent Application Publication No. 2001-284811 in that the connecting land 3 is exposed.

In the known technologies described in Japanese Unexamined Patent Application Publication No. 2001-284811 and Japanese Unexamined Patent Application Publication No. 11-074645, since the line conductor or the via conductor has the connecting land, an occurrence of a poor connection resulting from discrepancies between positions of the via conductor and the line conductor, their respective working errors, and the like in the preparation of the ceramic substrate can be prevented by the connecting land. However, there is a problem in that, for example, as shown in FIG. 9A, since a connecting land 3 extends from a via conductor 2 toward an adjacent via conductor 2, a reduction of pitch between the adjacent via conductors 2 is hindered by the amount of the protrusion of the connecting land. That is, when the pitch between the adjacent via conductors 2 is reduced, as shown in FIG. 10, the connecting land 3 and the adjacent via conductor 2 tend to be short-circuited, and delamination tends to occur during firing due to the difference in thermal expansion between the ceramic layer and the connecting land 3. Therefore, at least a clearance for preventing short circuiting and delamination is required between the adjacent via conductors 2, and an extended dimension of the connecting land 3 is further added to this clearance, so that the connecting land hinders a reduction of the pitch between the adjacent via conductors 2.

SUMMARY OF THE INVENTION

In order to overcome the problems described above, preferred embodiments of the present invention provide an internal conductor connection structure capable of increasing a density of internal wiring in accordance with, for example, a reduction of the pitch between external terminals of an integrated circuit, as well as a multilayer substrate.

An internal conductor connection structure according to a preferred embodiment of the present invention provides at least two via conductors adjacent to each other at a predetermined interval in an insulator substrate and line conductors disposed in the insulator substrate, wherein a first one of the via conductors includes a continuous via conductor arranged to extend in a direction away from the second via conductor, and the first via conductor is connected to the line conductor through the continuous via conductor.

The internal conductor connection structure according to another preferred embodiment of the present invention includes a connecting portion of the line conductor to the continuous via conductor or a connecting portion of the continuous via conductor to the line conductor disposed as a connecting land having an area larger than a connecting portion of the other conductor.

A multilayer substrate according to another preferred embodiment of the present invention includes a laminate in which a plurality of insulator layers are laminated, at least first and second via conductors individually extending inside the laminate from positions adjacent to each other at a predetermined interval on a first main surface of the laminate, and a first line conductor connected to the first via conductor, wherein the first via conductor includes a first continuous via conductor arranged to extend in a direction away from the second via conductor, and the first via conductor is connected to the first line conductor through the first continuous via conductor.

The multilayer substrate according to another preferred embodiment of the present invention includes a third via conductor at predetermined distances from the first and second via conductors, the third via conductor extending inside the laminate from the first main surface of the laminate, wherein the second via conductor includes a second continuous via conductor arranged to extend in a direction away from both the first and third via conductors, and the second via conductor is connected to a second conductor line through the second continuous via conductor.

The multilayer substrate according to another preferred embodiment of the present invention includes the first continuous via conductor and the second continuous via conductor disposed in different insulator layers.

The multilayer substrate according to another preferred embodiment of the present invention includes the first continuous via conductor and the second continuous via conductor disposed in insulator layers that are thinner than other insulator layers.

The multilayer substrate according to another preferred embodiment of the present invention provides that the first continuous via conductor and the second continuous via conductor penetrate through their respective insulator layers.

The multilayer substrate according to another preferred embodiment of the present invention provides that the first continuous via conductor and the second continuous via conductor do not penetrate through their respective insulator layers.

The multilayer substrate according to another preferred embodiment of the present invention includes a connecting portion of the first line conductor to the first continuous via conductor or a connecting portion of the first continuous via conductor to the first line conductor disposed as a connecting land larger than a connecting portion of the other conductor.

The multilayer substrate according to another preferred embodiment of the present invention includes a connecting portion of the second continuous via conductor to the second line conductor or a connecting portion of the second line conductor to the second continuous via conductor disposed as a connecting land larger than a connecting portion of the other conductor.

The multilayer substrate according to another preferred embodiment of the present invention includes a surface electrode connected to each of the via conductors disposed on the first main surface.

The multilayer substrate according to another preferred embodiment of the present invention includes an electronic component mounted on the first main surface, and external terminal electrodes of this electronic component are connected to the first via conductor and the second via conductor exposed at the main surface without any surface electrode.

The multilayer substrate according to another preferred embodiment of the present invention provides that the first main surface side is arranged to be connected to a mother board.

The multilayer substrate according to another preferred embodiment of the present invention provides that the insulator layer is made of a low-temperature sinterable ceramic material.

The multilayer substrate according to another preferred embodiment of the present invention provides that each of the via conductors and the line conductors is individually made of an electrically conductive material primarily containing silver or copper.

According to preferred embodiments of the present invention, an internal conductor connection structure capable of increasing a density of internal wiring in accordance with, for example, a reduction of the pitch between external terminals of an integrated circuit, as well as a multilayer substrate, can be provided.

Other features, elements, characteristics, and advantages of the present invention will become more apparent from the following description of preferred embodiments of the present invention with reference to the attached drawings.

BRIEF DESCRIPTION OF THE DRAWINGS

FIG. 8 is a sectional view showing a key portion of another preferred embodiment of the multilayer substrate of the present invention.

FIG. 9A is a sectional view showing a key portion thereof, and FIG. 9B is a plan view showing a connection structure of a via conductor and a line conductor, viewed from the via conductor side.

DETAILED DESCRIPTION OF PREFERRED EMBODIMENTS

The present invention will be described below based on preferred embodiments shown in FIG. 1A to FIG. 8.

First Preferred Embodiment

Figures 1A, 1B:
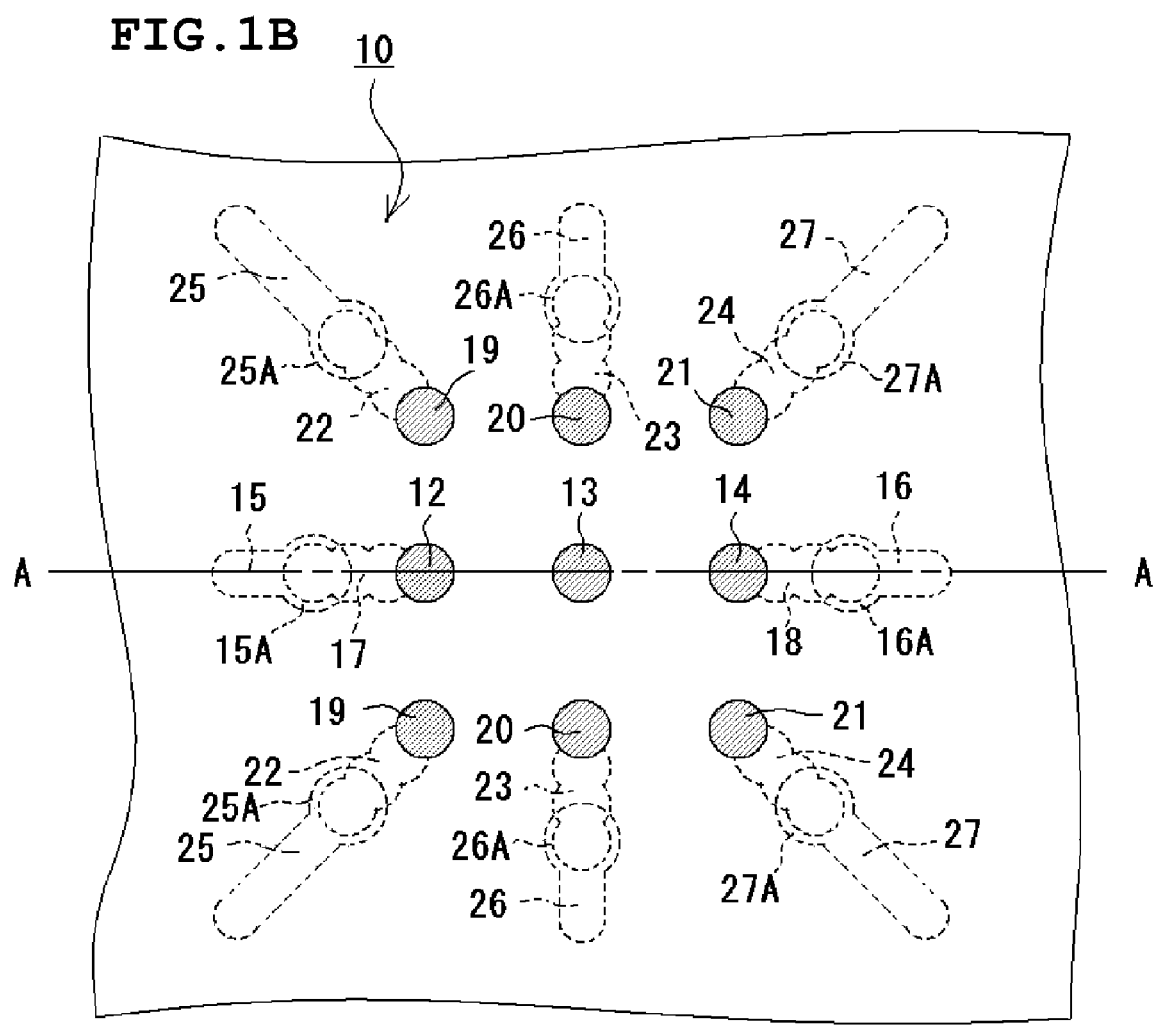
FIG. 1A is a sectional view of a preferred embodiment of an internal conductor connection structure of the present invention taken along a line A-A shown in FIG. 1B.
FIG. 1B is a plan view of FIG. 1A.

As schematically shown in, for example, FIGS. 1A and 1B, an internal conductor connection structure 10 of the present preferred embodiment is configured as an internal conductor which includes a plurality of via conductors (three units in FIGS. 1A and 1B), first, second, and third via conductors 12, 13, and 14, and first and third line conductors 15 and 16 connected to the first and third via conductors 12 and 14, respectively. The via conductors are disposed at predetermined intervals from each other in a horizontal direction with a predetermined pattern in an insulator substrate (ceramic multilayer substrate) 11 including a laminate in which a plurality of insulator layers (for example, ceramic layers) 11A are laminated, and extend inside the ceramic multilayer substrate 11 from the surface. The internal conductor electrically connects, for example, an integrated circuit (not shown in the drawing) mounted on the top surface of the ceramic multilayer substrate 11 to a mother board (not shown in the drawing) provided with the ceramic multilayer substrate 11.

As shown in FIGS. 1A and 1B, for example, the first and third via conductors 12 and 14 include first and third continuous via conductors 17 and 18, respectively, arranged to extend in their respective directions away from the adjacent second via conductor 13 and, in addition, the first and third via conductors 12 and 14 are connected to the first and third line conductors 15 and 16, respectively, through the first and third continuous via conductors 17 and 18, respectively. The first and third via conductors 12 and 14 have no protrusions extending from the first and third via conductors 12 and 14 toward the adjacent via conductor 13 to connect the first and third via conductors 12 and 14 to the first and third line conductors 15 and 16, respectively, through the first and third continuous via conductors 17 and 18, respectively. Therefore, the distance from the first and third via conductors 12 and 14 to the adjacent via conductor 13 can be decreased, so that the pitch can be reduced.

As shown in FIG. 1B, the via conductors in the first line and the via conductors in the third line are vertically symmetrical. The via conductors in the first line are indicated as fourth, fifth, and sixth via conductors 19, 20, and 21, and the via conductors in the third line are also indicated as fourth, fifth, and sixth via conductors 19, 20, and 21. The continuous via conductors extending from the fourth, fifth, and sixth via conductors 19, 20, and 21 are indicated as fourth, fifth, and sixth continuous via conductors 22, 23, and 24, respectively. The line conductors connected to these continuous via conductors 22, 23, and 24 through connecting lands 25A, 26A, and 27A, respectively, are indicated as fourth, fifth, and sixth line conductors 25, 26 and 27, respectively. In FIG. 1B, the first and third via conductors 12 and 14 and the fourth, fifth, and sixth via conductors 19, 20, and 21 are arranged to become vertically and bilaterally symmetrical with respect to the second via conductor 13. The fourth, fifth, and sixth continuous via conductors 22, 23, and 24 are arranged to extend in directions away from the adjacent via conductors, and are connected to the fourth, fifth, and sixth line conductors 25, 26 and 27 at the ends of the extensions. A relationship among the fourth, fifth, and sixth via conductors 19, 20, and 21 is similar to the relationship among the first, second, and third via conductors 12, 13, and 14.

As shown in FIG. 1B, the first and third continuous via conductors 17 and 18 and the fourth, fifth, and sixth continuous via conductors 22, 23, and 24 are arranged to extend radially from the first and third via conductors 12 and 14 and the fourth, fifth, and sixth via conductors 19, 20, and 21 toward the outside, thus centering the second via conductor 13. The direction of extension of the continuous via conductor is determined based on the pattern of via conductors and line conductors connected thereto. However, it is essential only that the continuous via conductor is arranged to extend in a direction away from an adjacent via conductor. In FIG. 1A, the first and second continuous via conductors 17 and 18 are provided in the same ceramic layer 11A. However, interference between the line conductors can be prevented by providing the first and second continuous via conductors 17 and 18 and the fourth, fifth, and sixth continuous via conductors 22, 23, and 24 in mutually different ceramic layers 11A depending on the wiring state of the line conductors. Therefore, the continuous via conductors can be defined as a via conductor group in which a plurality of via conductors are successively disposed and continuously integrated in one insulator layer (for example, one ceramic layer).

Figure 2A:
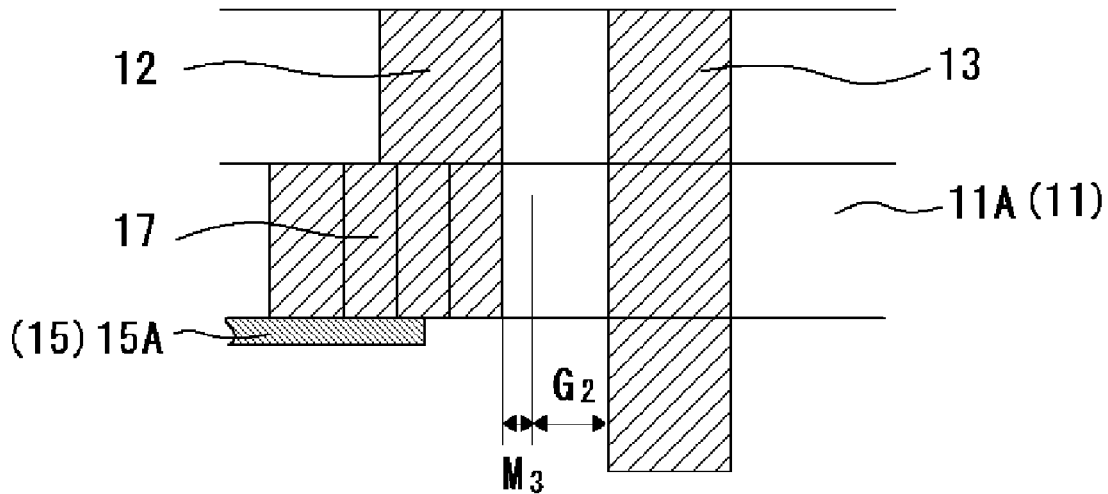
FIG. 2A is an explanatory diagram for explaining a reduction of pitch of the internal conductor connection structure shown in FIGS. 1A and 1B.
Figure 2B:
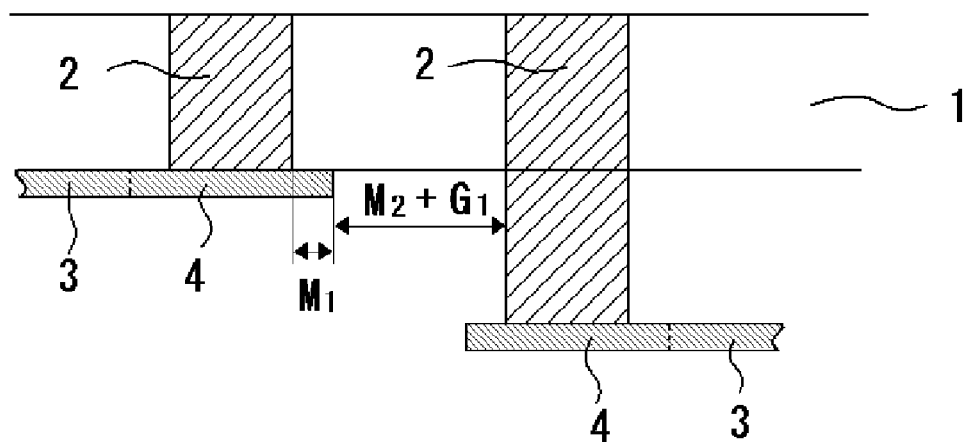
FIG. 2B is an explanatory diagram of the pitch of a known connection structure.
Figure 9A:
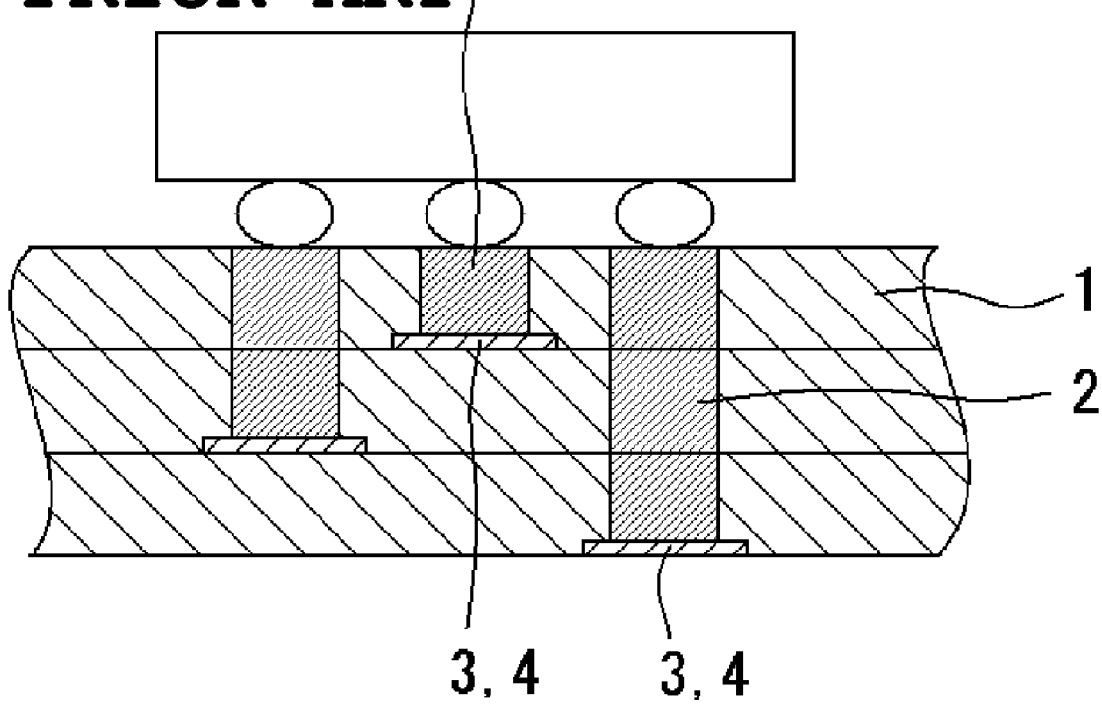
FIGS. 9A and 9B show a known multilayer substrate.
Figure 9B:
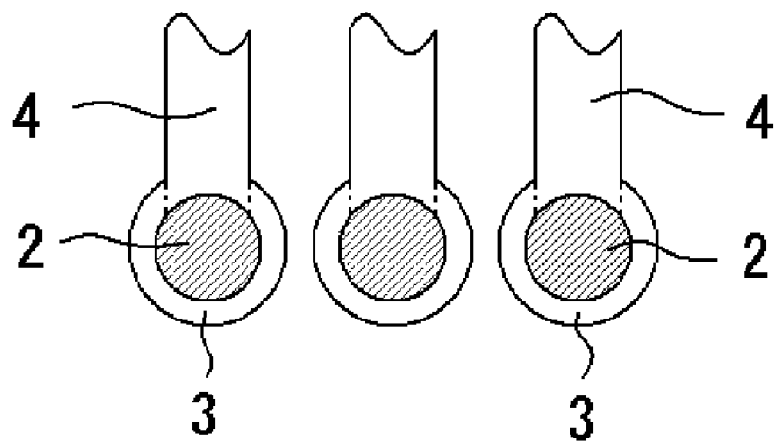
Figure 10:
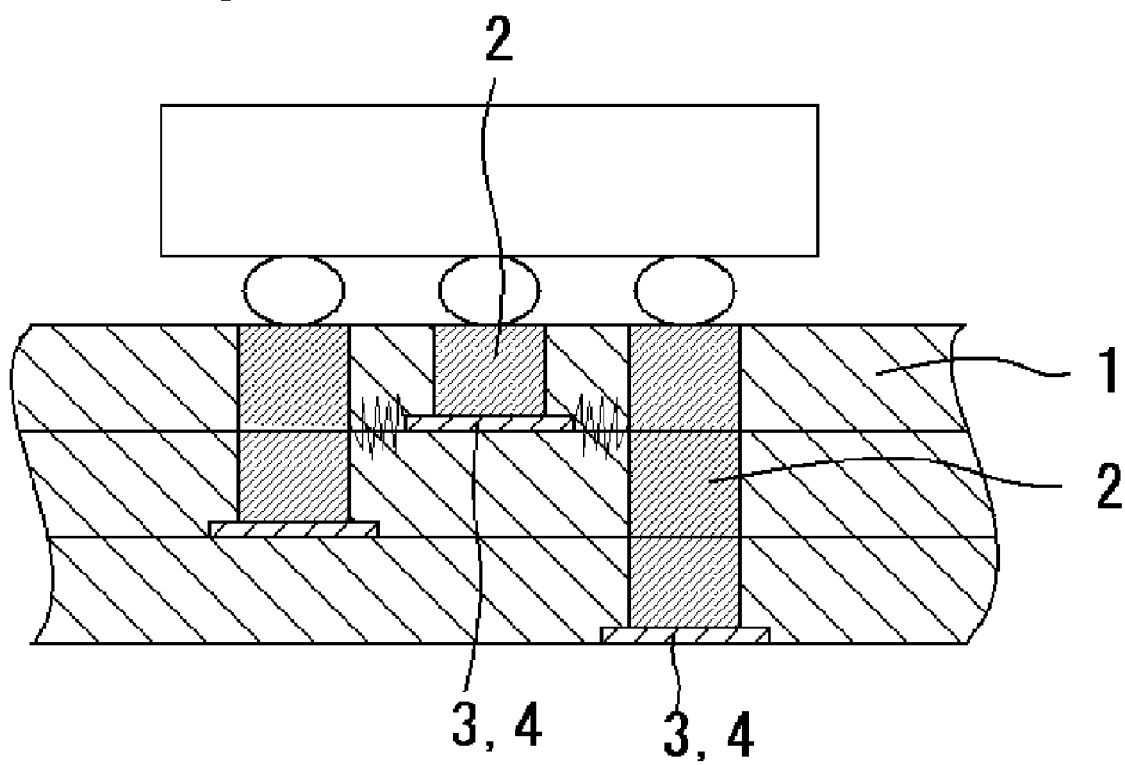
FIG. 10 is an explanatory diagram showing the state in which the via conductor and the line conductor in the multilayer substrate shown in FIGS. 9A and 9B are short-circuited.

The extent to which the pitch in the internal conductor connection structure 10 of the present preferred embodiment can be reduced in comparison with a known connection structure shown in FIGS. 9A and 9B will be described using the first and second via conductors 12 and 13 as examples with reference to FIGS. 2A and 2B. In the known connection structure, as shown in FIG. 2B, a distance $(M_1+M_2+G_1)$, that is, the total sum of a protruding dimension $M_1$ of the connecting land 4 from the via conductor 2 required to reliably connect the via conductor 2 to the line conductor 3, a minimum dimension $G_1$ required to avoid occurrence of short circuiting and delamination between the connecting land 4 and the adjacent via conductor 2, and furthermore, a margin $M_2$ required to ensure a minimum gap even when a discrepancy between positions occurs, must be ensured between the adjacent via conductors 2. In general, this distance $(M_1+M_2+G_1)$ is on the order of about 200 μm. Consequently, it is difficult to reduce the pitch by decreasing the distance between the via conductors 2 to within about 200 μm in the known connection structure.

On the other hand, in the connection structure 10 of the present preferred embodiment, a distance $(M_3+G_2)$, that is, the total sum of a minimum dimension $G_2$ required to avoid occurrence of short circuiting and delamination between the first via conductor 12 and the adjacent second via conductor 13 and a margin $M_3$ required to ensure the gap $G_2$ even when a discrepancy of positions occurs between the first and second via conductors 12 and 13 must be required between the first and second via conductors 12 and 13 adjacent to each other. The dimension $G_2$ in the connection structure 10 of the present preferred embodiment and the dimension $G_1$ in the known connection structure are substantially the same dimension. The margin $M_3$ is determined based on the relationship between the first via conductor 12 and the second via conductor 13. Since the first via conductor 12 to be connected to the first line conductor 15 and the second via conductor 13 disposed successively are provided in the same process, the factor of error is only the precision in via processing, and factors, such as elongation of the pattern during printing the line including the connecting land and an increase in working error resulting from undergoing two processes of the via processing and the printing of lines, are eliminated, in contrast to the known connection structure shown in FIG. 2B, so that the amount of discrepancy of the positions becomes small. Consequently, the present preferred embodiment has a first advantage that the protruding dimension $M_1$, which is required to ensure the reliability in connection, of the connecting land larger than the via diameter becomes unnecessary and a second advantage that the margin $M_2$ is allowed to become small, while the margin $M_2$ is necessary for preventing occurrence of short circuiting and cracking (delamination) with respect to the adjacent first and second via conductors 12 and 13 when the discrepancy between positions occurs. Therefore, the distance between the first via conductor 12 and the second via conductor 13 in the present preferred embodiment can be decreased to, for example, on the order of about 100 μm, that is, one-half the known distance, so that the pitch can be significantly reduced.

As shown in FIGS. 1A and 1B, the first continuous via conductor 17 is formed to penetrate one layer of the ceramic layer 11A, and four substantially cylindrical conductors, each having the same diameter as that of the first via conductor 12, are successively formed in a horizontal direction while overlapping one another. The first continuous via conductor 17 can be formed into a substantially linear shape by filling a conductive paste in slim-shaped through holes overlapping one another and disposed in a ceramic green sheet (not shown in the drawing) by using a laser light or the like to have the same diameter as that of the first via conductor 12, followed by sintering as a ceramic multilayer substrate, in the production of the ceramic multilayer substrate. The longitudinal side surface of this first continuous via conductor 17 is formed to be a concave and convex surface composed of linked arc-shaped surfaces. As shown in FIG. 1B, the first line conductor 15 has a connecting land 15A defining a connecting portion that is connected to the first continuous via conductor 17. This connecting land 15A preferably has a substantially circular shape and an outer diameter larger than the outer diameter of an end portion of the extension of the first continuous via conductor 17. Therefore, even when a discrepancy occurs to some extent between the positions of the first line conductor 15 and the first via conductor 12, these two components 12 and 15 can be reliably connected through the first via conductor 17. Although the connecting land 15A has an outer diameter larger than the outer diameter of the first via conductor 12, since the connecting land 15A is located at a position farther away from the second via conductor 13 than the first via conductor 12, a protrusion from the first via conductor 12 toward the second via conductor 13 is unnecessary, and a reduction of pitch between the first and second via conductors 12 and 13 is not hindered. Also, the second line conductor 16 has a connecting land 16A defining a connecting portion that is connected to the second continuous via conductor 18.

In the internal conductor connection structure 10 of the present preferred embodiment, the connecting land 15A is disposed on the first line conductor 15. However, the connecting land may be disposed on the continuous via conductor 17 side. In this case, for example, the connection structure can be realized by making the outer diameter of only the circular conductor farthest from the second via conductor 13 larger than the outer diameter of the first via conductor 12.

According to the present preferred embodiment, in the internal conductor connection structure having first, second, and third via conductors 12, 13, and 14 and first and third line conductors 15 and 16, the first and third via conductors 12 and 14 are connected to the first and third line conductors 15 and 16 through the first and third continuous via conductors 17 and 18 arranged to extend in directions away from the adjacent second via conductor 13. Consequently, the first and third via conductors 12 and 14 have no protrusion extending toward the second via conductor 13 side, the pitch between the first and third via conductors 12 and 14 and the second via conductor 13 can be reduced, and accordingly, a high-density wiring can be realized in accordance with a reduction of pitch between external terminals of an integrated circuit.

Since the first via conductor 12 and the first line conductor 15 are connected through the end portion of the extension of the first continuous via conductor 17, even when the connecting land 15A is disposed on the first line conductor 15, the connecting land 15A does not protrude from the first via conductor 12 toward the second via conductor 13 side. Therefore, a discrepancy between positions of the first continuous via conductor 17 and the first line conductor 15 can be compensated for by the connecting land 15A in the production of the ceramic multilayer substrate 11, so that the first via conductor 12 and the first line conductor 15 can be reliably connected.

Second Preferred Embodiment

Another preferred embodiment of the multilayer substrate of the present invention will be described below with reference to FIG. 3 to FIG. 7. Since the multilayer substrate of the present preferred embodiment is provided with the internal conductor connection structure, primarily only the via conductors adjacent to each other will be described.

Figure 3A:
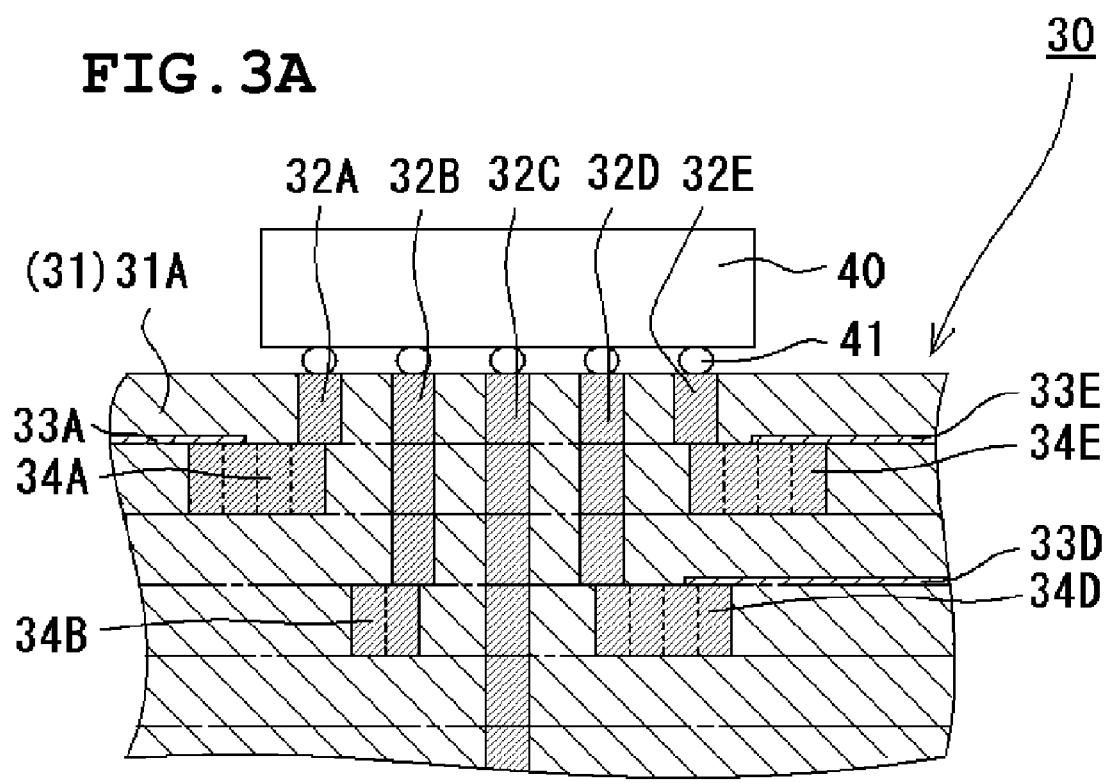
FIG. 3A is a sectional view of a key portion of a preferred embodiment of a multilayer substrate of the present invention thereof.
Figure 3B:
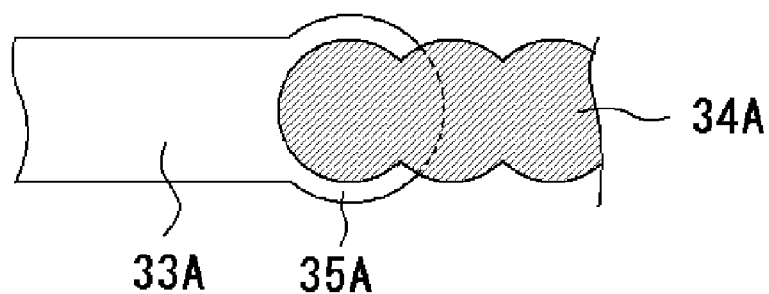
FIG. 3B is a plan view showing a connection structure of a via conductor and a line conductor, viewed from the via conductor side.
Figure 3C:
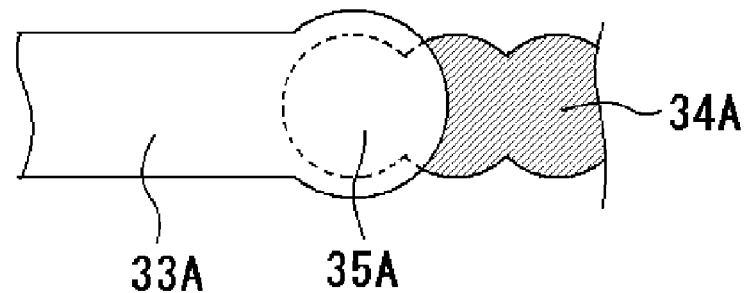
FIG. 3C is a plan view showing the connection structure of the via conductor and the line conductor, viewed from the line conductor side.

As shown in FIGS. 3A to 3C, for example, the multilayer substrate (for example, ceramic multilayer substrate) 30 of the present preferred embodiment includes a laminate 31 in which a plurality of insulator layers (for example, ceramic layers) 31A are laminated. First, second, third, fourth, and fifth via conductors 32A, 32B, 32C, 32D, and 32E independently extend inside the laminate 31 from their respective positions at a predetermined interval (for example, about 100 μm) from each other on a first main surface (top surface) of the laminate 31. First, second, third, fourth, and fifth line conductors 33A, 33B, 33C, 33D, and 33E are connected to first, second, third, fourth, and fifth via conductors 32A, 32B, 32C, 32D, and 32E, respectively. An integrated circuit 40 is mounted on the top surface of the laminate 31. For example, the first via conductor 32A and the second via conductor 32B are adjacent to each other as shown in FIG. 3A. A plurality of external terminals (not shown in the drawing) of the integrated circuit 40 are electrically connected to the first to fifth via conductors 32A to 32E through solder balls 41. These via conductors 32A to 32E are connected to the line conductors 33A to 33E, respectively, with the same connection structure. Therefore, the first via conductor 32A and the first line conductor 33A will be described, while the other via conductors and line conductors are indicated only by reference numerals and the explanations thereof will not be provided. In the present preferred embodiment, the external terminals of the integrated circuit 40 are connected directly to the first to fifth via conductors 32A to 32E exposed at the top surface of the laminate 31 without any surface electrode (connecting pad). Consequently, application to the external terminals having a reduced pitch can be performed satisfactorily. If there is an allowance for space on the surface of the laminate 31, surface electrodes corresponding to the external terminals may be disposed on the top surface of the laminate 31, and via conductors may be connected to these surface electrodes. The alignment of the external terminals of the integrated circuit 40 with the via conductors is facilitated by using the surface electrodes.

As shown in FIG. 3A, the first via conductor 32A includes the first continuous via conductor 34A arranged to extend in a direction away from the adjacent second via conductor 32B (leftward in the drawing) and, in addition, the first via conductor 32A is connected to a first line conductor 33A through the first continuous via conductor 34A. The first continuous via conductor 34A and the first line conductor 33A are configured as in the connection structure 10 shown in FIG. 1. That is, in the first continuous via conductor 34A of the first via conductor 32A, cylindrical conductors are linearly arranged and integrated while overlapping one another and penetrating the ceramic layer 31A. In contrast to the connection structure 10 of the first preferred embodiment, the first continuous via conductor 34A is disposed in such a way that the entirety is shifted in a direction away from the second via conductor 32B. By shifting the first continuous via conductor 34A, even when a discrepancy between positions of the first continuous via conductor 34A and the first via conductor 32A occurs, the first continuous via conductor 34A is prevented from extending toward the second via conductor 32B side. As shown in FIGS. 3B and 3C, a connecting land 35A having a diameter larger than the outer diameter of the cylindrical conductor is formed integrally on the connecting portion to the first continuous via conductor 34A of the first line conductor 33A. In the present preferred embodiment, the first via conductor 32A and the first line conductor 33A are preferably independently connected to the same surface (top surface) side of the first continuous via conductor 34A.

Figure 4:
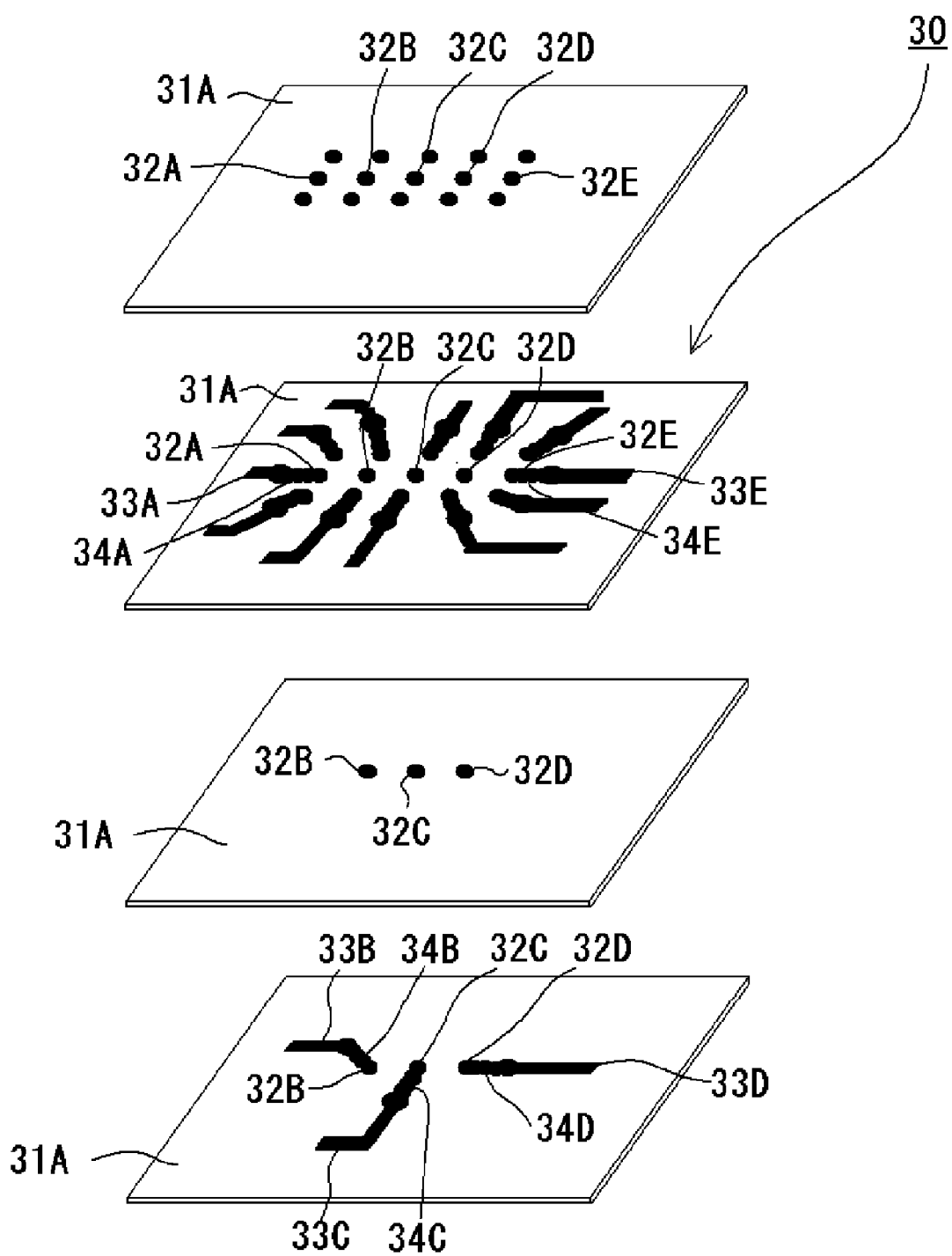
FIG. 4 is an exploded perspective view showing the multilayer substrate shown in FIG. 3A on an individual ceramic layer basis.

FIG. 4 is an exploded view showing the multilayer substrate 30 shown in FIG. 3 on a ceramic layer 31A basis. In FIG. 4, only those related to the first to fifth via conductors 32A to 32E in the second line are assigned reference numerals. As shown in FIG. 4, a plurality of lines (three lines in FIG. 4) of the first to fifth via conductors 32A to 32E are disposed on the ceramic layer 31A serving as the first layer constituting the top surface of the laminate 31, and these via conductors 32A to 32E are arranged in a matrix as a whole. The first to fifth via conductors 32A to 32E, continuous via conductors 34A and 34E, and line conductors 33A and 33E are disposed on the ceramic layer 31A serving as the second layer. Only the second, third, and fourth via conductors 32B, 32C, and 32D are disposed on the ceramic layer 31A serving as the third layer. The second, third, and fourth via conductors 32B, 32C, and 32D and their respective continuous via conductors 34B, 34C, and 34D and line conductors 33B, 33C, and 33D are disposed on the ceramic layer 31A serving as the fourth layer. The continuous via conductors in every ceramic layer 31A are arranged to extend in directions away from adjacent via conductors. In FIG. 4, portions having large outer diameters at the connecting portions of the via conductors and the line conductors are connecting lands of the line conductors.

In the case where the adjacent first and second via conductors 32A and 32B are connected to the first line conductor 33A and the second line conductor 33B, respectively, through the first and second continuous via conductors 34A and 34B, respectively, as shown in FIG. 3A, the first and second continuous via conductors 34A and 34B can be disposed in mutually different laminated ceramic layers 31A and 31A and, thereby, interference between the line conductors can be prevented so that the via conductors can be arranged densely.

Preferably, for example, a low-temperature sinterable ceramic material is used as the material for forming the ceramic layer 31A. The low-temperature sinterable ceramic material refers to a material that can be sintered at a firing temperature of, for example, about 1,000° C. or less, and can be co-sintered with a low-melting point metal, e.g., Ag or Cu. Examples of low-temperature sinterable ceramic materials may include glass composite materials formed by mixing borosilicate glass into ceramic powders, e.g., alumina and forsterite, crystallized glass materials through the use of $ZnO$—$MgO$—$Al_2O_3$—$SiO_2$ crystallized glass, and non-glass materials through the use of $BaO$—$Al_2O_3$—$SiO_2$ ceramic powders, $Al_2O_3$—$CaO$—$SiO_2$—$MgO$—$B_2O_3$ ceramic powders, and the like.

Electrically conductive materials having small resistivities may be used as the via conductors, the continuous via conductors, and the line conductors. Preferably, for example, an electrically conductive material primarily containing Ag or Cu that can be sintered simultaneously with a low-temperature sinterable ceramic material is used as the electrically conductive material. The conductors primarily containing Ag or Cu has a small electrical resistance and, therefore, has an advantage in the use of the ceramic multilayer substrate 30 as a high-frequency component.

A method for manufacturing the ceramic multilayer substrate 30 of the present preferred embodiment will be described below.

A low-temperature sinterable ceramic material is dispersed in a vinyl alcohol based binder to prepare a slurry. The resulting slurry is applied to a carrier film by a doctor blade method or the like, so that a ceramic green sheet for low temperature sintering is prepared. The ceramic green sheet is cut into a predetermined size.

Laser light (for example, $CO_2$ laser light) with a controlled output is applied from the carrier film side, the carrier film and the ceramic green sheet are penetrated, so that through holes used for via conductors are formed in both of them. In the case where through holes used for continuous via conductors are formed in the ceramic green sheet, the laser light is moved by the predetermined dimension to form successively, for example, four through holes in communication with one another. At this time, the laser light is moved in such a way that the through holes overlap one another. When the strength of the carrier film is inadequate, a weakly adhesive film (for example, a PET film coated with about 10 μm of acrylic adhesive) may be attached to a ceramic green sheet surface to hold the ceramic green sheet, and laser light may be applied to penetrate the carrier film, ceramic green sheet, and the weakly adhesive film so that the through holes may be formed.

Subsequently, a conductive paste is filled in the through holes from the carrier film side, and an excess conductive paste is removed from the carrier film. When the conductive paste is filled in the through holes, the ceramic green sheet may be placed on a support table with a suction mechanism, a negative pressure may be provided in the through holes and, thereby, the conductive paste may be reliably filled in the through holes. When the weak adhesive film is used, the weak adhesive film is peeled off the ceramic green sheet after the conductive paste is dried.

A predetermined pattern of the conductive paste is applied by screen printing to the ceramic green sheet on the carrier film, so that a wiring pattern for the line conductors having connecting lands is provided.

After the required number of ceramic green sheets are filled in and coated with the conductive paste for the via conductors and continuous via conductors and the line conductors are produced in the procedure, the ceramic green sheets are laminated and pressure-bonded at a predetermined pressure so that a green laminate is produced. At this time, even when a discrepancy occurs between positions of the portions filled in with the conductive paste for the via conductors and the wiring pattern for the line conductors resulting from working errors, discrepancies in lamination, and the like, this discrepancy between positions can be compensated for by the connecting lands. Therefore, the portions filled in with the conductive paste for the via conductors including the continuous via conductors and the wiring pattern for the line conductors can be reliably connected.

Thereafter, parting lines are preferably formed on the surface of the green laminate for dividing the laminate into individual ceramic multilayer substrates. The green laminate is fired at a predetermined temperature of about 1,000° C. or less to produce a sintered material. The sintered material is subjected to a plating treatment and the resulting sintered material is divided so that a plurality of ceramic multilayer substrates of the present preferred embodiment can be produced.

According to the present preferred embodiment, the laminate 31 in which a plurality of ceramic layers 31A are laminated, the first and second via conductors 32A and 32B independently extend inside the laminate 31 from their respective positions adjacent to each other at a predetermined interval on the top surface of this laminate 31 and the first line conductor 33A connects to the first via conductor 32A. The first via conductor 32A includes the first continuous via conductor 34A arranged to extend in a direction away from the second via conductor 32B and, in addition, the first via conductor 32A is connected to the first line conductor 33A through the first continuous via conductor 34A. That is, the connection structure of the first via conductor 32A and the first line conductor 33A has the same configuration as the internal conductor connection structure 10. Therefore, the pitch between the first and second via conductors 32A and 32B can be reduced in conformity with the external terminals of the integrated circuit 40. The relationship holds between other adjacent via conductors, for example, the second via conductor 32B and the third via conductor 32C, and a reduction of pitch between via conductors in every direction can be realized. Consequently, the ceramic multilayer substrate 30 of the present preferred embodiment can realize a high-density wiring in conformity with the integrated circuit 40.

According to the present preferred embodiment, for example, since the first and second continuous via conductors 34A and 34B of the adjacent first and second via conductors 32A and 32B are disposed in different ceramic layers 31A, the first and second continuous via conductors 34A and 34B do not interfere with each other, and can reliably be located in regions spaced away from the second and third via conductors 32B and 32C, respectively, adjacent thereto.

Third Preferred Embodiment

A ceramic multilayer substrate of the present preferred embodiment is configured in conformity with the ceramic multilayer substrate 30 in the second preferred embodiment except that the form of a continuous via conductor and a line conductor are different from those of the ceramic multilayer substrate 30 in the second preferred embodiment. Therefore, the same components as or components corresponding to those of the ceramic substrate 30 in the second preferred embodiment are indicated by the same reference numerals as in the second preferred embodiment, and only featured components of the present preferred embodiment will be described.

Figure 5A:
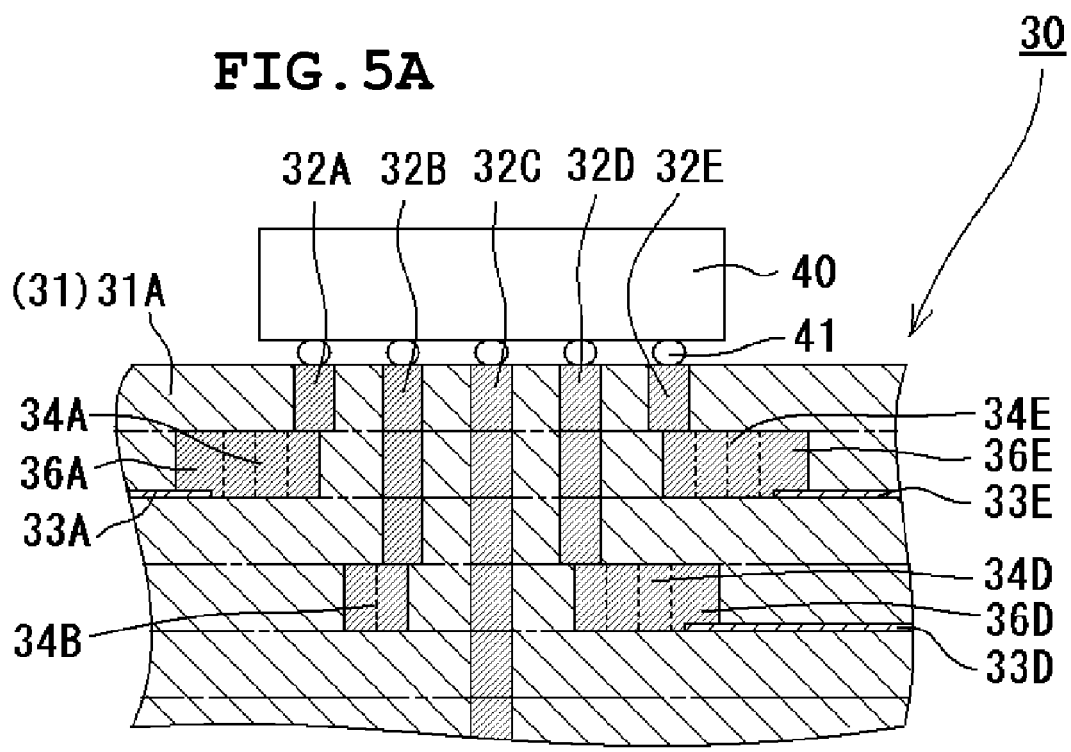
FIG. 5A is a sectional view showing a key portion of another preferred embodiment of the multilayer substrate of the present invention.
Figure 5B:
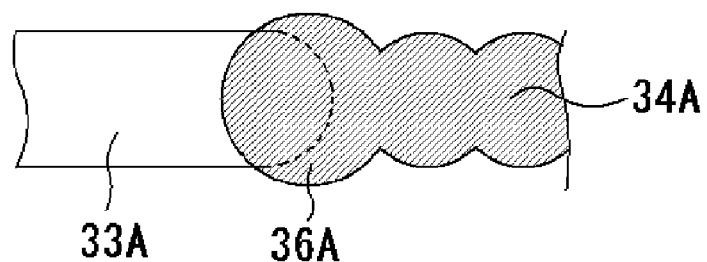
FIG. 5B is a plan view showing a connection structure of a via conductor and a line conductor, viewed from the via conductor side.
Figure 5C:
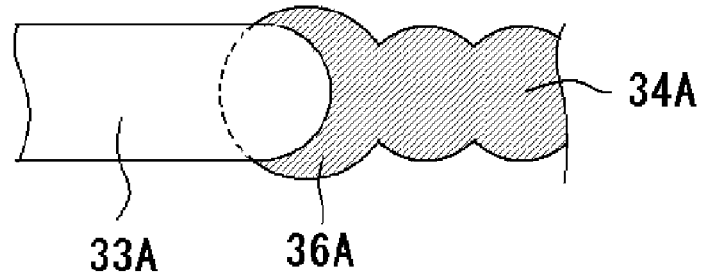
FIG. 5C is a plan view showing the connection structure of the via conductor and the line conductor, viewed from the line conductor side.

In the present preferred embodiment, as shown in FIGS. 5A to 5C, a connecting land 36A is disposed at the connecting portion (end portion of the extension) of the first continuous via conductor 34A to the first line conductor 33A in place of the connecting land 35A of the first line conductor 33A in the second preferred embodiment. This connecting land 36A is preferably formed from a substantially cylindrical conductor having a diameter larger than the outer diameter of the first via conductor 32A and the width of the first line conductor 33A. The other substantially cylindrical conductors of the first continuous via conductor 34A are preferably formed to have the same outer diameter as that of the first via conductor 32A. In the present preferred embodiment as well, the operation and the effect similar to those in the second preferred embodiment can be expected. In the present preferred embodiment, the first line conductor 33A is connected to a surface of the first continuous via conductor 34A which is the surface opposite to the surface on which the first via conductor 32A is disposed.

Fourth Preferred Embodiment

A ceramic multilayer substrate of the present preferred embodiment is configured in conformity with the ceramic multilayer substrate 30 in the second preferred embodiment except that the continuous via conductor is different from that of the ceramic multilayer substrate 30 in the second preferred embodiment. Therefore, the same components as or components corresponding to those of the ceramic substrate 30 in the first preferred embodiment are indicated by the same reference numerals, and only featured components of the present preferred embodiment will be described.

Figure 6:
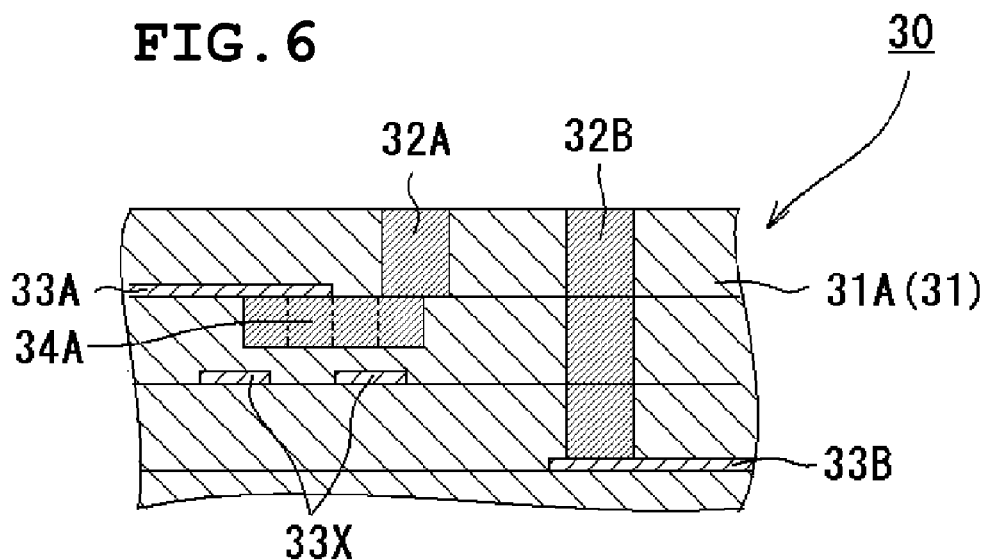
FIG. 6 is a sectional view showing a key portion of another preferred embodiment of the multilayer substrate of the present invention.

In the present preferred embodiment, as shown in FIG. 6, a first continuous via conductor 34A does not penetrate a ceramic layer 31A, and is formed by filling in a concave portion formed in the ceramic layer 31A. A first line conductor 33A is connected to the top surface of the first continuous via conductor 34A. The first line conductor 33A has a connecting land as in the second preferred embodiment. The output of laser light is reduced compared to that in the second preferred embodiment in order that the laser light does not penetrate the ceramic green sheet. The laser light is applied to the ceramic green sheet and, thereby, a concave portion can be formed in the ceramic green sheet. This concave portion is filled in with a conductive paste, followed by firing, so that the first continuous via conductor 34A shown in FIG. 6 can be produced. In the present preferred embodiment, since the conductive paste is filled in the concave portion, leakage of the conductive paste can be prevented, and a highly reliable via conductor can be produced. Since the first continuous via conductor 34A does not penetrate the ceramic layer 31A, even when line conductors 33X are disposed at the positions overlapping the first continuous via conductor 34A, as shown in FIG. 6, the first via conductor 32A and the line conductor 33X are not brought into contact with each other. Therefore, in contrast to the first to third preferred embodiments, it is not necessary to interpose a ceramic green sheet with no printed components therebetween during production, so that the thickness of the laminated layer 31 can be decreased, and slimming of the ceramic multilayer substrate 30 can be facilitated. Even in the case where a ceramic green sheet is interposed, the sheet thickness can be decreased and, accordingly, slimming can be facilitated. In addition, the operations and the effects similar to those in the second and third preferred embodiments can be expected.

Figure 7:
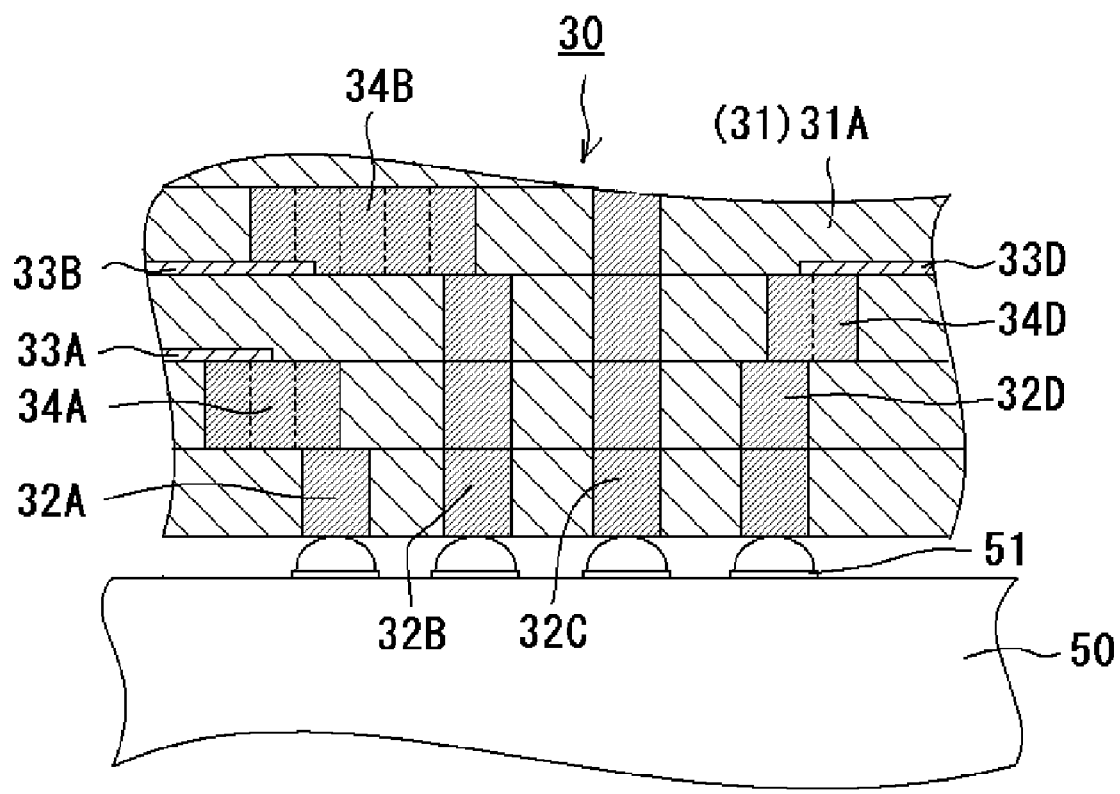
FIG. 7 is a sectional view showing a key portion of another preferred embodiment of the multilayer substrate of the present invention.

For example, as shown in FIG. 7, the ceramic multilayer substrates 30 of the second to fourth preferred embodiments can be mounted on a mother board 50. In this case, the via conductor 32 exposed at the bottom surface of the laminate 31 is connected to a terminal electrode 51 of the mother board 50 through solder. The exposed via conductor 32 may be connected directly to the terminal electrode 51 of the mother board 50 without any surface electrode (connecting pad), and it is possible to cope with a reduction of the pitch between the terminal electrodes 51. Therefore, high density mounting of the ceramic multilayer substrate 30 on the mother board can be performed, while active components, e.g., integrated circuits, and passive components, e.g., chip type ceramic electronic components, are installed on the top surface of the ceramic multilayer substrate 30.

Fifth Preferred Embodiment

A ceramic multilayer substrate of the present preferred embodiment is configured in conformity with the ceramic multilayer substrate 30 in the second preferred embodiment except that the insulator layer (for example, ceramic layer) including a continuous via conductor is provided to have a thickness smaller than the thicknesses of the other insulator layers. Therefore, the same components as or components corresponding to those of the ceramic substrate 30 in the second preferred embodiment are indicated by the same reference numerals as in the second preferred embodiment, and only featured components of the present preferred embodiment will be described.

In the present preferred embodiment, as shown in FIG. 8, a ceramic layer 31'A provided with a first continuous via conductor 34A is formed to have a thickness smaller than the thicknesses of the other ceramic layers 31A. This first continuous via conductor 34A is formed to penetrate the ceramic layer 31'A as in the first to third preferred embodiments. Furthermore, when line conductors 33X are disposed at positions overlapping this first continuous via conductor 34A, as shown in FIG. 8, the ceramic layer 31'A thinner than the other ceramic layers 31A is interposed between the two components, 34A and 33X. By such a configuration, the laminate 31 can be made with thinner layers as compared with those in the first to third preferred embodiments, and slimming of the ceramic multilayer substrate 30 can be facilitated. In addition, the control of the laser light output becomes unnecessary as compared with the fourth preferred embodiment.

That is, in the first to third preferred embodiments, the first continuous via conductor 34A penetrates the ceramic layer 31A. Therefore, in the case where the line conductors 33X are disposed at positions overlapping the first continuous via conductor 34A, a ceramic green sheet with no printed components must be interposed in order to avoid contact with the first continuous via conductor 34A, so that the ceramic multilayer substrate 30 becomes thicker by the thickness of the ceramic layer with no printed components. In the fourth preferred embodiment, since the first continuous via conductor 34A does not penetrate the ceramic layer 31 and, therefore, is of a non-penetration type, the laser light output must be controlled when the concave portion for the first continuous via conductor 34A is disposed. On the other hand, in the fifth preferred embodiment, the inconveniences in the first to fourth preferred embodiments can be eliminated.

In each of the preferred embodiments, the case where the continuous via conductor is connected to the line conductor is explained. However, the continuous via conductor according to other preferred embodiments of the present invention can also be used in the case where via conductors are connected to each other in place of the line conductor. When the via conductors are arranged in a matrix, and the via conductors to be connected to each other are arranged while being sandwiched from both sides by other via conductors, they can be connected reliably by connecting through the use of the continuous via conductor. The through holes for the continuous via conductor are disposed in the stage of formation of the through holes for via conductors and, therefore, can be precisely formed without an occurrence of discrepancy between positions resulting from, for example, printing of line conductors. In the case where the via conductors are connected to each other with the line conductor, a discrepancy in printing of the line conductors and a discrepancy between positions of the via conductors and the line conductors in the lamination stage of the ceramic green sheets tend to occur. Furthermore, since the line conductor includes the connecting land, if a discrepancy between positions of the line conductor and the via conductor occurs, the via conductors and the connecting land sandwiching these via conductors may be brought close or into contact. Even when the connection is established, short circuiting may occur between the connecting land and adjacent via conductors.

The present invention is not limited to each of the preferred embodiments described above. For example, in the case where the continuous via conductor is of the type of penetrating the ceramic layer, a leakage of conductive paste can reliably be prevented by forming each cylindrical conductor of the continuous via conductor into the shape of an inverted truncated cone, or put another way, by forming the through hole for each cylindrical conductor disposed in the ceramic green sheet into the shape of an inverted truncated cone.

The present invention is suitable for use as a multilayer substrate for use in mounting various chip type electronic components, for example.

While preferred embodiments of the present invention have been described above, it is to be understood that variations and modifications will be apparent to those skilled in the art without departing the scope and spirit of the invention. The scope of the invention, therefore, is to be determined solely by the following claims.

The invention claimed is:

1. An internal conductor connection structure comprising:
   an insulator substrate including a plurality of insulating layers;
   line conductors disposed in the insulator substrate; and
   at least two via conductors adjacent each other at a predetermined interval in the insulator substrate, at least one of the at least two via conductors including a continuous via conductor arranged to extend in a direction away from the other via conductor; wherein
   the at least one of the at least two via conductors is connected to one of the line conductors through the continuous via conductor;
   the continuous via conductor has a dimension in a direction in which the line conductors extend that is greater than a dimension of the at least two via conductors in the direction in which the line conductors extend;
   the continuous via conductor is disposed in one of the plurality of insulating layers;
   one of the at least two via conductors is disposed in another one of the plurality of insulating layers that is different from the one of the plurality of insulating layers in which the continuous via conductor is disposed; and
   one end portion of the continuous via conductor is directly connected to the one of the at least two via conductors, and an opposite end portion, but not the one end portion, of the continuous via conductor is directly connected to the one of the line conductors.

2. The internal conductor connection structure according to claim 1, wherein a connecting portion of the line conductor to the continuous via conductor or a connecting portion of the continuous via conductor that is connected to the line conductor is arranged to be a connecting land having an area larger than the connecting portion of the other conductor.

3. A multilayer substrate comprising:
   a laminate including a plurality of laminated insulator layers;
   at least first and second via conductors extending inside the laminate from positions adjacent to each other at a predetermined interval from a first main surface of the laminate;
   a first line conductor connected to the first via conductor, the first via conductor including a first continuous via conductor arranged to extend in a direction away from the second via conductor; wherein the first via conductor is connected to the first line conductor through the first continuous via conductor;

the first continuous via conductor has a dimension in a direction in which the first line conductor extends that is greater than a dimension of the first via conductor in the direction in which the first line conductor extends;

the first continuous via conductor is disposed in one of the plurality of laminated insulating layers;

the first via conductor is disposed in another one of the plurality of laminated insulating layers that is different from the one of the plurality of laminated insulating layers in which the first continuous via conductor is disposed; and one end portion of the first continuous via conductor is directly connected to the first via conductor, and an opposite end portion, but not the one end portion, of the first continuous via conductor is directly connected to the first line conductor.

4. The multilayer substrate according to claim 3, further comprising a third via conductor extending inside the laminate from the first main surface of the laminate, the second via conductor includes a second continuous via conductor arranged to extend in a direction away from both the first and third via conductors, wherein the second via conductor is connected to a second line conductor through the second continuous via conductor.

5. The multilayer substrate according to claim 4, wherein the first continuous via conductor and the second continuous via conductor are arranged in different insulator layers.

6. The multilayer substrate according to claim 4, wherein the first continuous via conductor and the second continuous via conductor are arranged in an insulator layer that is thinner than the other insulator layers.

7. The multilayer substrate according to claim 4, wherein the first continuous via conductor and the second continuous via conductor penetrate through their respective insulator layers.

8. The multilayer substrate according to claim 4, wherein the first continuous via conductor and the second continuous via conductor do not penetrate through their respective insulator layers.

9. The multilayer substrate according to claim 4, wherein a connecting portion of the second continuous via conductor that is connected to the second line conductor or a connecting portion of the second line conductor that is connected to the second continuous via conductor is arranged to be a connecting land that is larger than the connecting portion of the other conductor.

10. The multilayer substrate according to claim 3, wherein a connecting portion of the first line conductor to the first continuous via conductor or a connecting portion of the first continuous via conductor to the first line conductor is arranged to be a connecting land larger than the connecting portion of the other conductor.

11. The multilayer substrate according to claim 3, further comprising a surface electrode connected to each of the via conductors disposed on the first main surface.

12. The multilayer substrate according to claim 3, further comprising an electronic component mounted on the first main surface, and external terminal electrodes of the electronic component are connected to the first via conductor and the second via conductor exposed at the first main surface without any surface electrode.

13. The multilayer substrate according to claim 3, further comprising a mother board connected to the first main surface.

14. The multilayer substrate according to claim 3, wherein the insulator layer includes a low-temperature sinterable ceramic material.

15. The multilayer substrate according to claim 3, wherein each of the via conductors and the line conductors individually include an electrically conductive material containing silver or copper.

16. The multilayer substrate according to claim 3, wherein the first continuous via conductor only partially overlaps with the first via conductor.

* * * * *